(12) United States Patent
Chen et al.

(10) Patent No.: US 10,516,048 B2
(45) Date of Patent: Dec. 24, 2019

(54) FABRICATION OF SEMICONDUCTOR DEVICE

(71) Applicant: TAIWAN SEMICONDUCTOR MANUFACTURING CO., LTD, Hsinchu (TW)

(72) Inventors: I-Chih Chen, Tainan (TW); Ying-Lang Wang, Taichung (TW); Chih-Mu Huang, Tainan (TW); Ying-Hao Chen, Tainan (TW); Wen-Chang Kuo, Tainan (TW); Jung-Chi Jeng, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/804,887

(22) Filed: Nov. 6, 2017

(65) Prior Publication Data

US 2018/0061987 A1  Mar. 1, 2018

Related U.S. Application Data

(63) Continuation of application No. 14/224,961, filed on Mar. 25, 2014, now Pat. No. 9,812,569.

(60) Provisional application No. 61/927,847, filed on Jan. 15, 2014.

(51) Int. Cl.
*H01L 29/78* (2006.01)
*H01L 29/167* (2006.01)
*H01L 29/08* (2006.01)
*H01L 29/66* (2006.01)
*H01L 29/165* (2006.01)

(52) U.S. Cl.
CPC ...... *H01L 29/7848* (2013.01); *H01L 29/0847* (2013.01); *H01L 29/167* (2013.01); *H01L 29/66628* (2013.01); *H01L 29/66636* (2013.01); *H01L 29/165* (2013.01)

(58) Field of Classification Search
CPC ............... H01L 29/7848; H01L 29/165; H01L 29/66636; H01L 29/66795; H01L 29/785
See application file for complete search history.

(56) References Cited

U.S. PATENT DOCUMENTS

| 7,759,199 B2* | 7/2010 | Thomas ............ H01L 21/02381 438/269 |
| 2009/0026552 A1 | 1/2009 | Zhang et al. |
| 2009/0273034 A1 | 11/2009 | Woon et al. |
| 2012/0091540 A1 | 4/2012 | Cheng et al. |
| 2013/0285146 A1 | 10/2013 | Tung |

* cited by examiner

*Primary Examiner* — Tony Tran
(74) *Attorney, Agent, or Firm* — Maschoff Brennan

(57) ABSTRACT

A method of fabricating a semiconductor device includes following steps. A trench is formed in a substrate. A barrier layer and an epitaxy layer are formed in sequence in the trench. The barrier layer has a first dopant. A source/drain recess cavity is formed by etching at least the epitaxial layer. A source/drain region is formed in the source/drain recess cavity. The source/drain region has a second dopant.

20 Claims, 14 Drawing Sheets

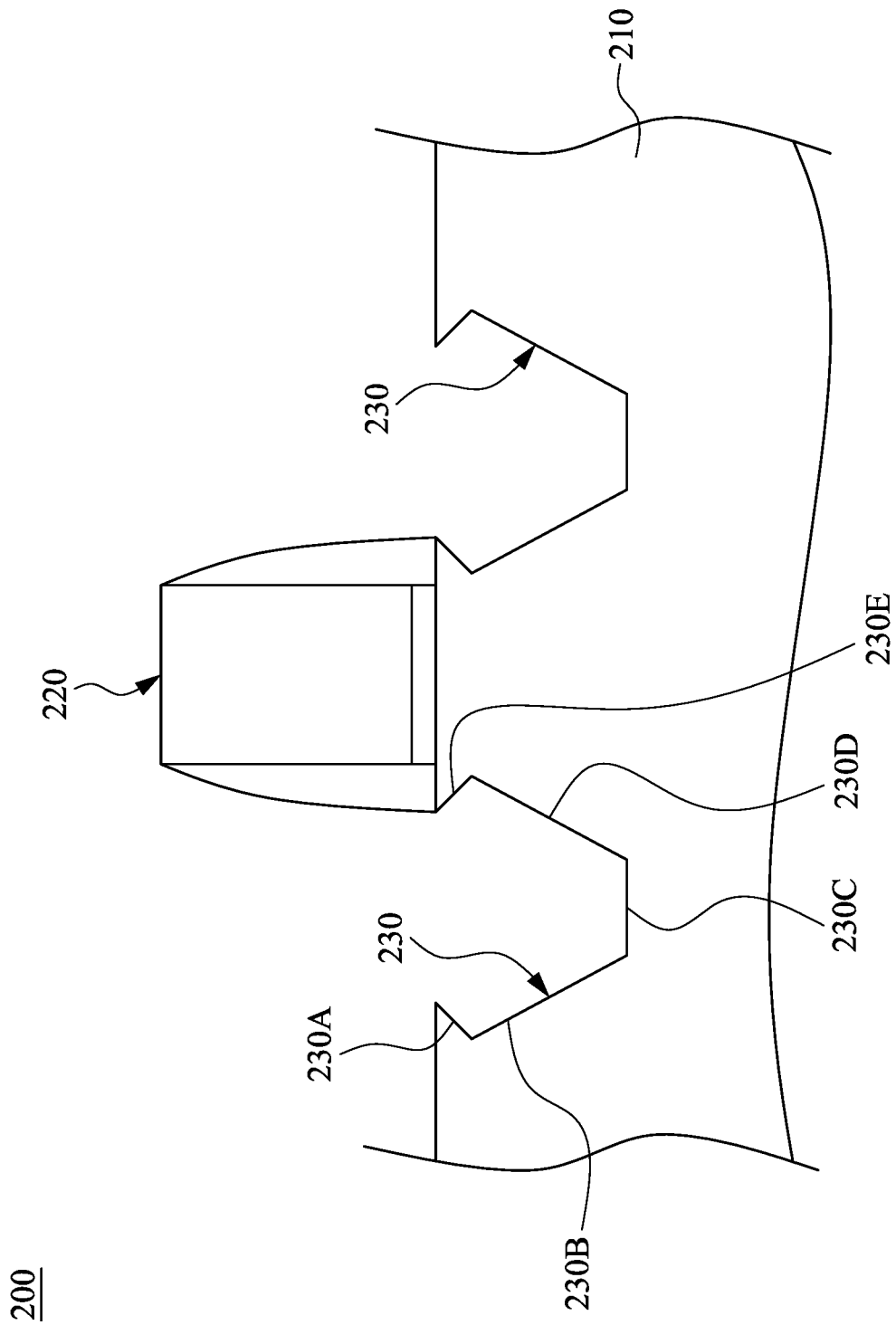

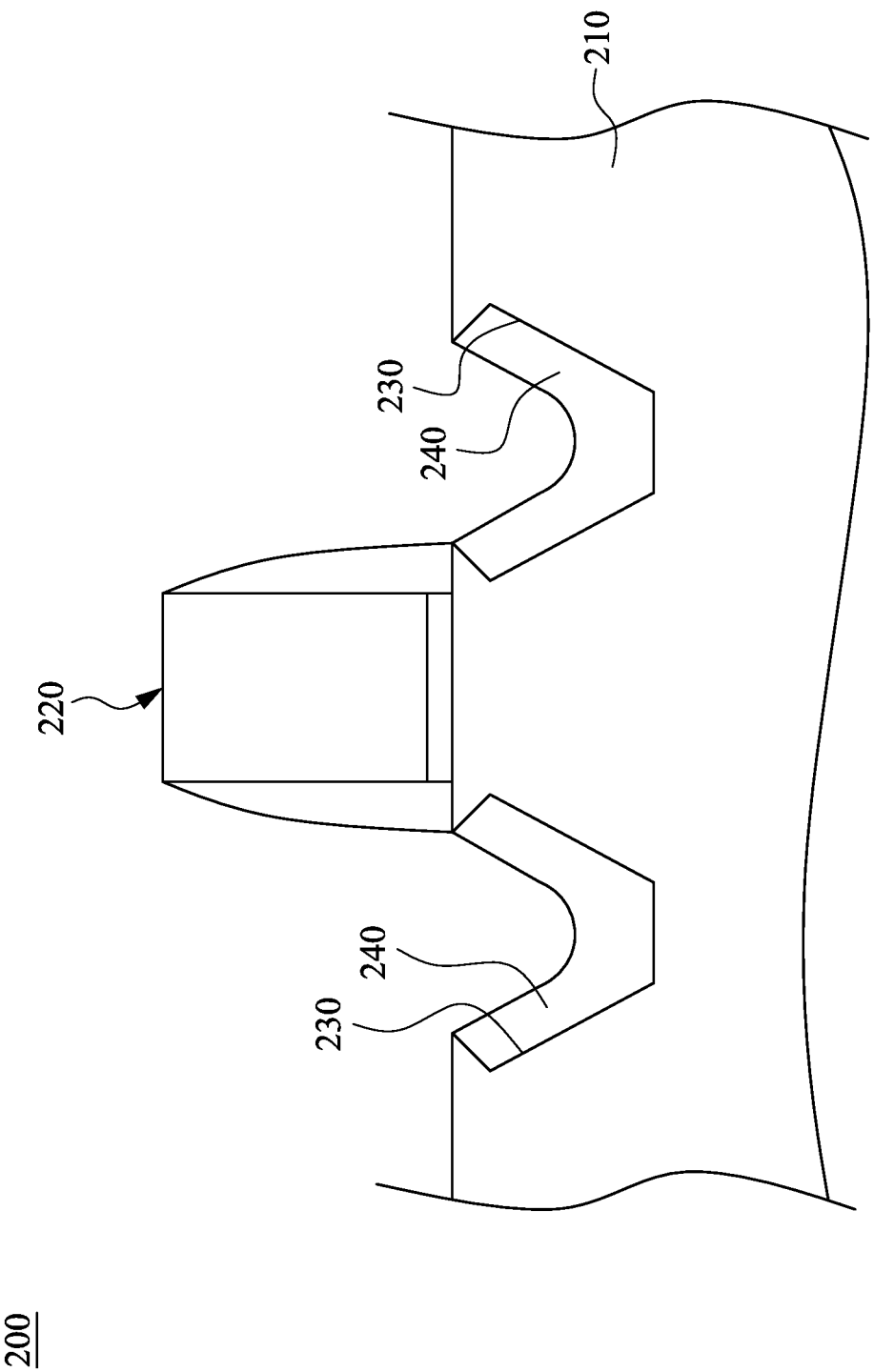

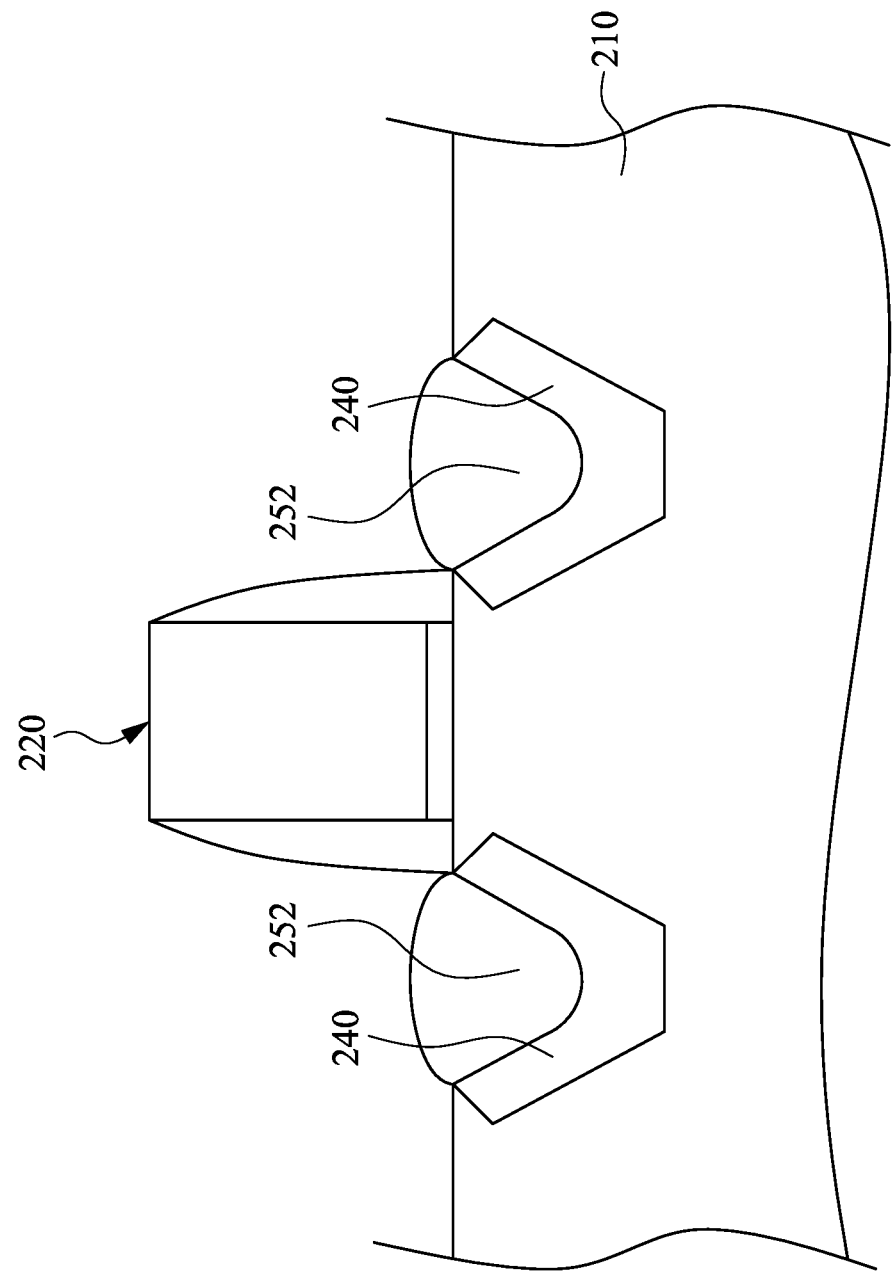

FABRICATION OF SEMICONDUCTOR DEVICE

PRIORITY CLAIM AND CROSS-REFERENCE

The present application is a continuation application of U.S. application Ser. No. 14/224,961, filed Mar. 25, 2014, which claims priority to U.S. Provisional Application Ser. No. 61/927,847, filed Jan. 15, 2014, which is herein incorporated by reference in their entirety.

BACKGROUND

Manufacturing of an integrated circuit (IC) has been largely driven by the need to increase the density of the integrated circuit formed in a semiconductor device. This is typically accomplished by implementing more aggressive design rules to allow larger density of IC device to be formed. Nonetheless, the increased density of the IC devices has also increased the complexity of processing semiconductor devices with the decreased feature sizes.

The IC device is an integrated circuit (IC) chip, system on chip (SoC), or portion thereof, that includes various passive and active microelectronic components, such as metal-oxide-semiconductor field effect transistors (MOSFETs). Being basic logic building blocks in the formation of the IC, semiconductor manufactures utilize a wide variety of techniques to improve the performance of the MOSFETs. The performance of MOSFETs may be increased by enhancing the carrier mobility of silicon, so as to reduce resistance and power consumption and to increase drive current, frequency response and operating speed. A way of enhancing carrier mobility is the introduction of strained structures in source/drain recess cavities of the MOSFET, which includes a p-type metal-oxide-semiconductor (PMOS) and an n-type metal-oxide-semiconductor (NMOS), utilizing selectively grown silicon germanium (SiGe). However, there are challenges to implement such features in MOSFET. As the gate length decrease, the problems become obvious. For example, the effect of ion implantation depth and doped profile in the source/drain regions to the threshold voltage become significant.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2G are cross-sectional views at various stages of fabricating the semiconductor device according to the method of FIG. 1.

DETAILED DESCRIPTION

Figure 1:
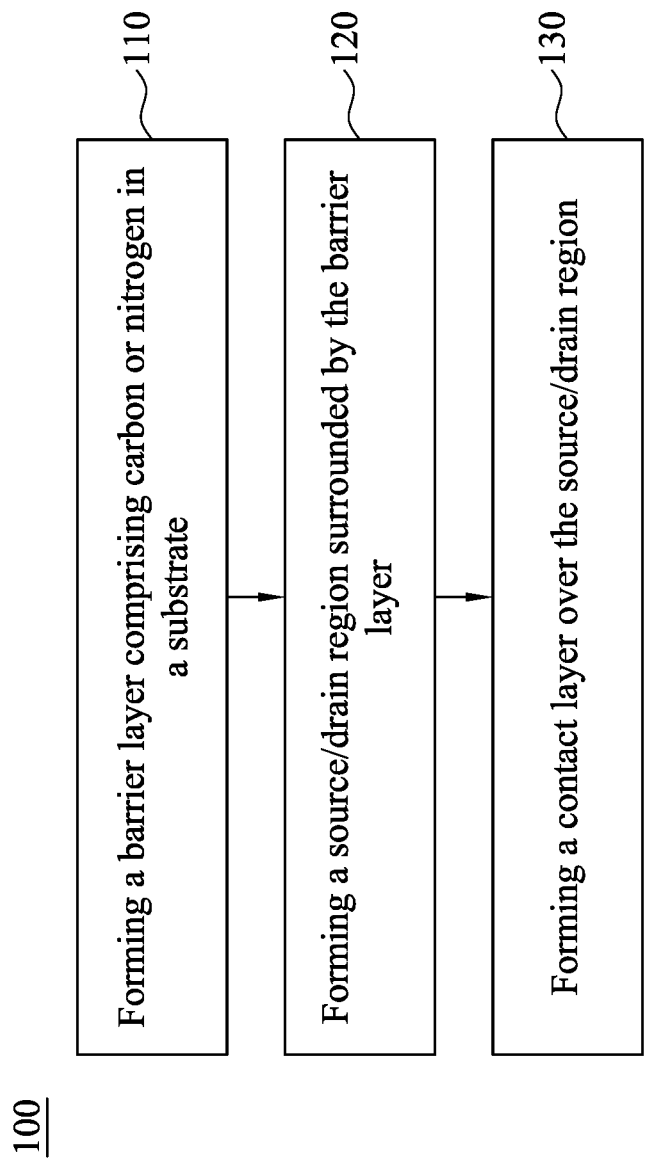
FIG. 1 is a flow chart of a method for fabricating a semiconductor device according to various embodiments of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

As used herein, the terms "comprising," "including," "having," "containing," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

In order to enhance the carrier mobility to improve the semiconductor device performance with the decreased feature sizes in MOSFET, strained structures are fabricated in source/drain recess cavities. "Strained" structure of a substrate, e.g., silicon, may be formed by growing a layer of silicon on a silicon germanium substrate. The silicon germanium lattice is generally more widely spaced than a pure silicon lattice as a result of the presence of the larger germanium atoms in the lattice. Since the atoms of the silicon lattice align with the more widely spread silicon germanium lattice, a tensile strain is created in the silicon layer. The amount of tensile strain applied to the silicon lattice increases with the proportion of germanium in the silicon germanium lattice. However, when keep scaling down, the ion implantation depth and doped profile in the source/drain region affects the threshold voltage uniformity. For example, in PMOS, the source/drain regions are doped with boron, but the boron might diffuse to the n-well and substrate due to following fabrication processes, like a thermal treatment.

Therefore, in various embodiments of the present disclosure, a method of fabricating a semiconductor device and a semiconductor device are provided to improve threshold hold voltage and saturation current of MOSFET devices by doping carbon or nitrogen surrounding the source/drain regions, so as to control the doped profile in the source/drain regions.

With reference to FIGS. 1 and 2A-2G, a method 100 and a semiconductor device 200 are described below according to embodiments of the present disclosure. The semiconductor device 200 fabricated through FIGS. 2A-2G is a field effect transistor (MOSFET) of an integrated circuit having memory cells and/or logic circuits. In various embodiments, the semiconductor device 200, may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and combinations thereof. It is understood that additional operations can be provided before, during, and/or after the method 100, and some of the steps described below can be replaced or eliminated for additional embodiments of the method. In some embodiments, additional features can be added in the semiconductor device 200, and in some other embodiments some of the features described below can be replaced or eliminated.

Figure 2A:
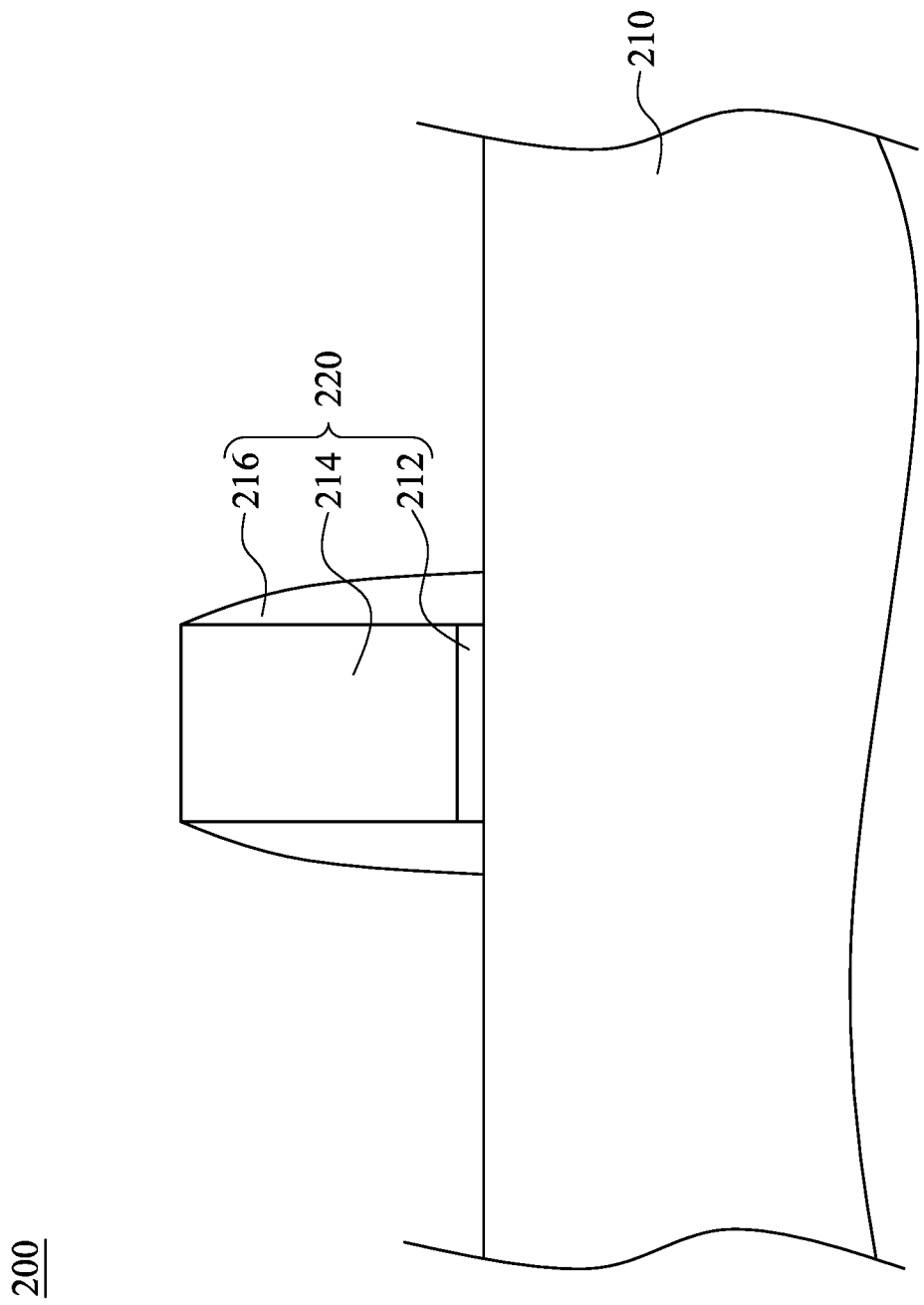

Referring to FIGS. 1 and 2A to 2C, operation 110 is to form a barrier layer including carbon or nitrogen in a substrate. Referring to FIG. 2A, a substrate 210 is provided. The substrate 210 includes a semiconductor material like silicon, germanium, carbon, another semiconductor material as an III-V or II-VI material, or combinations thereof. In embodiments, the substrate 210 includes a crystalline silicon substrate (e.g., wafer). Further, the substrate 210 may include an epitaxial layer, which is strained, and/or a silicon-on-insulator (SOI) structure. According to various embodiments of the present disclosure, the substrate 210 may include active regions including various doping configurations, such as p-wells and n-wells, depend on the design rules.

The gate structure 220 is on the substrate 210 and includes a dielectric layer 212 over the substrate 210, a gate electrode 214 over the dielectric layer 212, and two spacers 216 next to both sides of the gate electrode 214. In various embodiments of the present disclosure, the dielectric layer 212 includes silicon oxide or silicon nitride; the gate electrode 214 includes doped or non-doped polysilicon; and the spacers 216 include silicon oxide, silicon oxynitride or silicon nitride. In various embodiments of the present disclosure, the dielectric layer 212 includes high-k dielectric materials, which include $HfO_2$, HfSiO, HfSiON, HfTaO, HfTiO, HfZrO or combinations thereof. The gate electrode 214 includes metal such as aluminum, copper, tungsten, metal alloys, metal silicide, other suitable materials or combinations thereof. In various embodiments of the present disclosure, the dielectric layer 212 can be a multi-layer structure (not shown), including an interfacial layer over the substrate 210, or a work function layer under the gate electrode 214. The interfacial layer include silicon oxide, and the work function layer include TiN or TaN for PMOS and Ta, TiAl, TiAlN, or TaCN for NMOS. In embodiments, the gate structure 220 may be formed by deposition, lithography patterning, or etching processes.

Referring to FIGS. 1 and 2B, source/drain recess cavities are formed at both sides of the gate structure 220 on the substrate. Source/drain recess cavities 230 are formed in the substrate 210 next to the both sides of the gate structure 220. In various embodiments of the present disclosure, the source/drain recess cavities formation include two operations: performing an isotropic etching process at both sides of the gate structure to form the source/drain recess cavities in the substrate; and performing an anisotropic etching process to enlarge the source/drain recess cavities to a diamond shape in the substrate. The isotropic etching process include a dry etching process to remove portions of substrate 210 next to the both sides of the gate structure 220 to form the source/drain recess cavities 230 in the substrate 210. The anisotropic etching process includes wet etching to enlarge the source/drain recess cavities 230 into a diamond shape. In various embodiments of the present disclosure, the source/drain recess cavities 230 have respective sidewall surfaces, each defined by a bottom facet 230C, upper sidewall facets 230A and 230E, and lower sidewall facets 230B and 230D. Thus, the facet 230D and facet 230E formed intersect with each other and define an angle in the recess cavity 230, such that the diamond-shaped recess cavity 230 extends into the substrate 210 in the region right underneath the spacer 216 toward a channel region under the dielectric layer 212 in the substrate 210.

Referring to FIGS. 1 and 2C, in operation 110, a barrier layer doped with carbon or nitrogen is formed in the substrate. The barrier layer 240 is formed over the source/drain recess cavities 230 in the substrate 210. The barrier layer 240 is formed by an epitaxy process to partially fill the source/drain recess cavities 230 of the diamond shape. Source/drain regions will be formed in the cavity in the following steps, and the barrier layer 240 is formed to surround the source/drain regions in the substrate 210. As used herein, the term "surround" means "all around". In various embodiments of the present disclosure, the barrier layer 240 includes silicon germanium (SiGe) and having a second dopant, which may be carbon or nitrogen. The second dopant may be formed by implant doping or in situ doping. In some embodiments, the semiconductor device 200 is a PMOS and the second dopant is carbon. The carbon dosage is in a range from about $10^{11}$ $cm^{-3}$ to about $10^{14}$ $cm^{-3}$. In some embodiments, carbon dosage is $10^{13}$ $cm^{-3}$. In some embodiments, the semiconductor device 200 is an NMOS and the second dopant is nitrogen. The nitrogen dosage is in a range from about $10^{15}$ $cm^{-3}$ to about $10^{19}$ $cm^{-3}$. The carbon and nitrogen have abilities to grab the atoms, such that the dopants in the source/drain region will not move into the substrate 210, thus may control the doped profile. The epitaxy process may include a selective epitaxy growth (SEG) process, cyclic deposition and etching (CDE) process, chemical vapor deposition (CVD) techniques (e.g., vapor-phase epitaxy (VPE) and/or ultra-high vacuum CVD (UHV-CVD)), molecular beam epitaxy (MBE), other suitable epitaxy processes, or combinations thereof.

According to a specific embodiment of barrier layer 240 with carbon dopant formation, the process chamber is kept at a temperature in the range from about 250° C. to about 1,000° C., for example, from about 500° C. to about 900° C. The appropriate temperature to conduct the epitaxial process may depend on the particular precursors used to deposit and/or etch the silicon and carbon-containing materials. In one or more embodiments, the process chamber is usually maintained at a pressure from about 0.1 Torr to about 200 Torr, the pressure may fluctuate during and between this deposition operation, but is generally constant.

During the epitaxial deposition process in some embodiments, the substrate 210 is exposed to a deposition gas to form a monocrystalline layer on the surface of the substrate 210. The specific exposure time of the deposition process is determined in relation to the exposure time during the etching process, as well as particular precursors and temperature used in the process.

In some embodiments, the deposition gas contains at least a silicon source, a carrier gas, and a carbon source. In alternative embodiments, the deposition gas may include at least one etchant, such as hydrogen chloride or chlorine.

In some embodiments, the silicon source is usually provided into the process chamber at a rate in a range from about 5 sccm to about 500 sccm, for example, from about 10 sccm to about 300 sccm, and specifically from about 50 sccm to about 200 sccm, more specifically, about 100 sccm. Silicon sources used in the deposition gas to deposit silicon and carbon-containing compounds include, but not limited to, silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where $X'$=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane ($(CH_3)SiH_3$), dimethylsilane ($(CH_3)_2SiH_2$), ethylsilane ($(CH_3CH_2)SiH_3$), methyldisilane ($(CH_3)Si_2H_5$), dimethyldisilane ($(CH_3)_2Si_2H_4$) and hexamethyldisilane ($(CH_3)_6Si_2$).

In some embodiments, the silicon source is usually delivered into the process chamber along with a carrier gas. The carrier gas has a flow rate from about 1 slm (standard liters per minute) to about 100 slm, for example, from about 5 slm to about 75 slm, and specifically from about 10 slm to about 50 slm, for example, about 25 slm. Carrier gases may include nitrogen ($N_2$), hydrogen ($H_2$), argon, helium and combinations thereof. An inert carrier gas is employed and includes nitrogen, argon, helium and combinations thereof. A carrier gas may be selected based on the precursor(s) used and/or the process temperature during the epitaxial process. Usually the carrier gas is the same throughout each step. However, some embodiments may use different carrier gases in particular steps.

In some embodiments, the carbon source is provided to the process chamber during the same step with the silicon source and carrier gas to form a silicon and carbon-containing compound, such as a silicon carbon material. The carbon source is usually provided into the process chamber at a rate in the range from about 0.1 sccm to about 20 sccm, for example, from about 0.5 sccm to about 10 sccm, and more specifically from about 1 sccm to about 5 sccm, for example, about 2 sccm. Carbon sources used to deposit silicon and carbon-containing compounds include, but not limited to, organosilanes, alkyls, alkenes and alkynes of ethyl, propyl and butyl. Such carbon sources include methyl silane ($CH_3SiH_3$), dimethylsilane ($(CH_3)_2SiH_2$), trimethylsilane ($(CH_3)_3SiH$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others.

The carbon concentration of an epitaxial layer is in the range from about 200 ppm to about 5 atomic %, for example, from about 1 atomic % to about 3 atomic %, more specifically at least about 2 atomic % or at least about 1.5 atomic %. Alternatively, a germanium source and a carbon source may both be added into the process chamber with the silicon source and carrier gas to form a silicon and carbon-containing compound, such as a silicon germanium carbon material.

Nitrogen is typically used as a carrier gas in some embodiments due to cost considerations associated with the use of argon and helium as a carrier gas. Despite the fact that nitrogen is generally much less expensive than argon, argon is used as a carrier gas in some embodiments, particularly in embodiments in which methylsilane is a silicon source gas. When using nitrogen as a carrier gas, the nitridizing of materials may occur on the substrate during deposition processes. However, high temperature, such as over 800° C., is used to activate nitrogen in such a manner. Therefore, nitrogen can be used as an inert carrier gas in processes conducted at temperatures below the nitrogen activation threshold in some embodiments.

The use of an inert carrier gas has several attributes during a deposition process. For example, an inert carrier gas may increase the deposition rate of the silicon-containing material. While hydrogen may be used as a carrier gas, during the deposition process, hydrogen has a tendency to adsorb or react to the substrate to form hydrogen-terminated surfaces. A hydrogen-terminated surface reacts much slower to epitaxial growth than a bare silicon surface. Therefore, the use of an inert carrier gas increases the deposition rate by not adversely affecting the deposition reaction.

In one example, once the deposition process is terminated, the process chamber may be flushed with a purge gas or the carrier gas and/or the process chamber may be evacuated with a vacuum pump. The purging and/or evacuating processes remove excess deposition gas, reaction by-products and other contaminates. In some embodiments, implant doping is used instead of in situ doping.

Figure 2D:
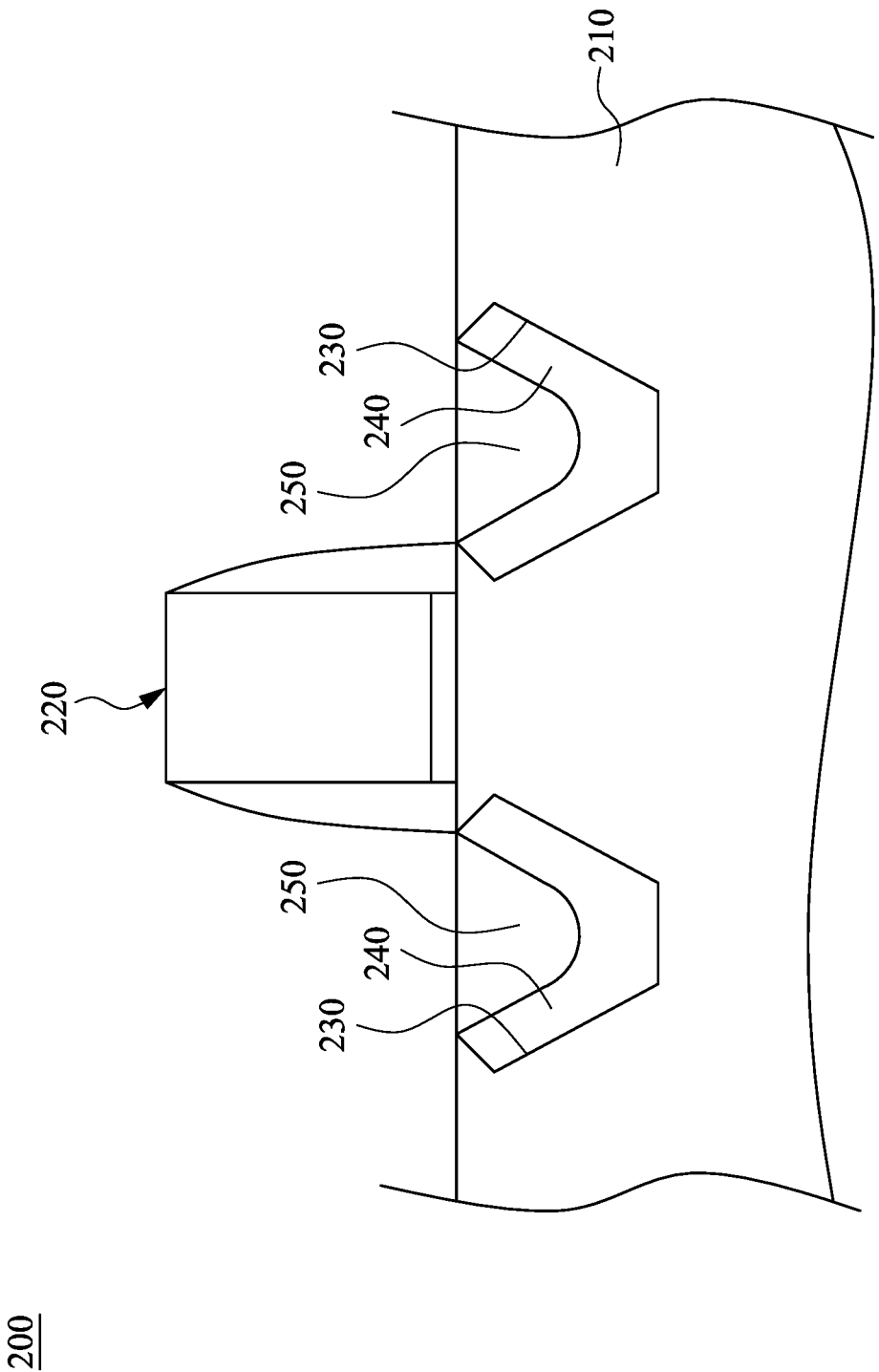

Referring to FIGS. 1, 2D and 2E, in operation 120, the source/drain regions are formed over the barrier layer in the source/drain recess cavities, and are surrounded by the barrier layer. The source/drain regions 250,252 are formed over the barrier layer 240 in the source/drain recess cavities 230 next to the gate structure 220. The source/drain regions 250, 252, which are filled into the source/drain recess cavities 230, are formed by an epitaxy process. The epitaxy process may include a selective epitaxy growth (SEG) process, cyclic deposition and etching (CDE) process, chemical vapor deposition (CVD) techniques (e.g., vapor-phase epitaxy (VPE) and/or ultra-high vacuum CVD (UHV-CVD)), molecular beam epitaxy (MBE), other suitable epitaxy processes, or combinations thereof. In various embodiments of the present disclosure, the source/drain regions 250 have a top surface substantially co-planer with the top surface of the substrate 210 as shown in FIG. 2D. In various embodiments of the present disclosure, the source/drain regions 252 have the top surface higher than the top surface of the substrate 210 as shown in FIG. 2E. In some embodiments, the source/drain regions 250, 252 include silicon, and the source/drain regions having a first dopant. The first dopant may include P-type dopants such as boron, aluminum, indium, or gallium or N-type dopants such as phosphorus, arsenic, antimony, or bismuth. The first dopant dosage is in a range from about $1\times10^{20}$ $cm^{-3}$ to about $9\times10^{20}$ $cm^{-3}$, and a thickness of the source/drain region is in a range from about 25 nm to about 35 nm. In some embodiments, the source/drain regions 250, 252 further include germanium (Ge). Silicon germanium (SiGe) is a strained material to enhance the carrier mobility in the semiconductor device 200. In various embodiments of the present disclosure, the semiconductor device is PMOS; the source/drain regions 250,252 include SiGe; and the first dopant is boron. In some embodiments of the present disclosure, the boron concentration is $10^{20}$ $cm^{-3}$. In various embodiments of the present disclosure, the semiconductor device is NMOS; the source/drain regions 250, 252 include silicon carbide (SiC); and the first dopant is phosphorous or arsenic.

Figure 2F:
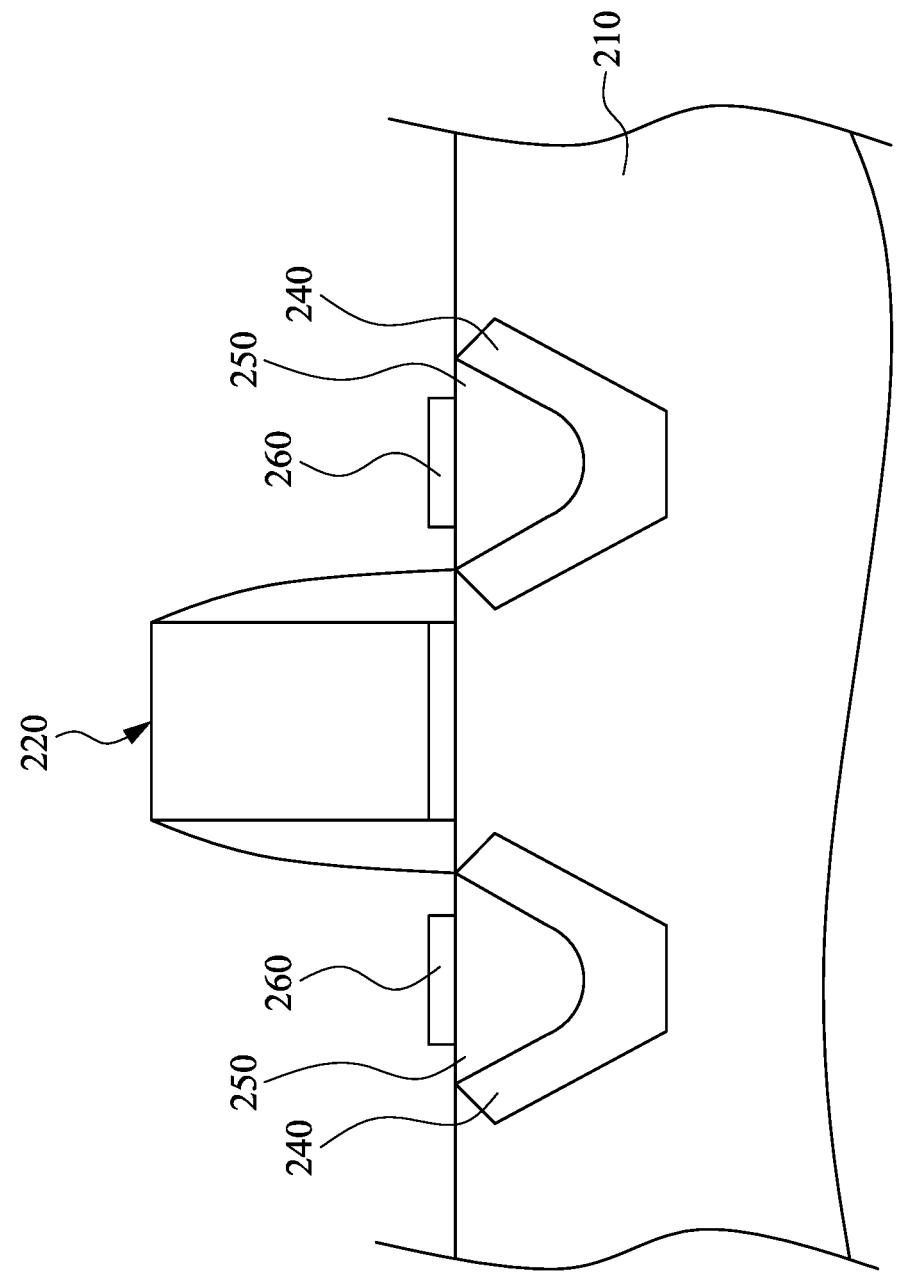
Figure 2G:
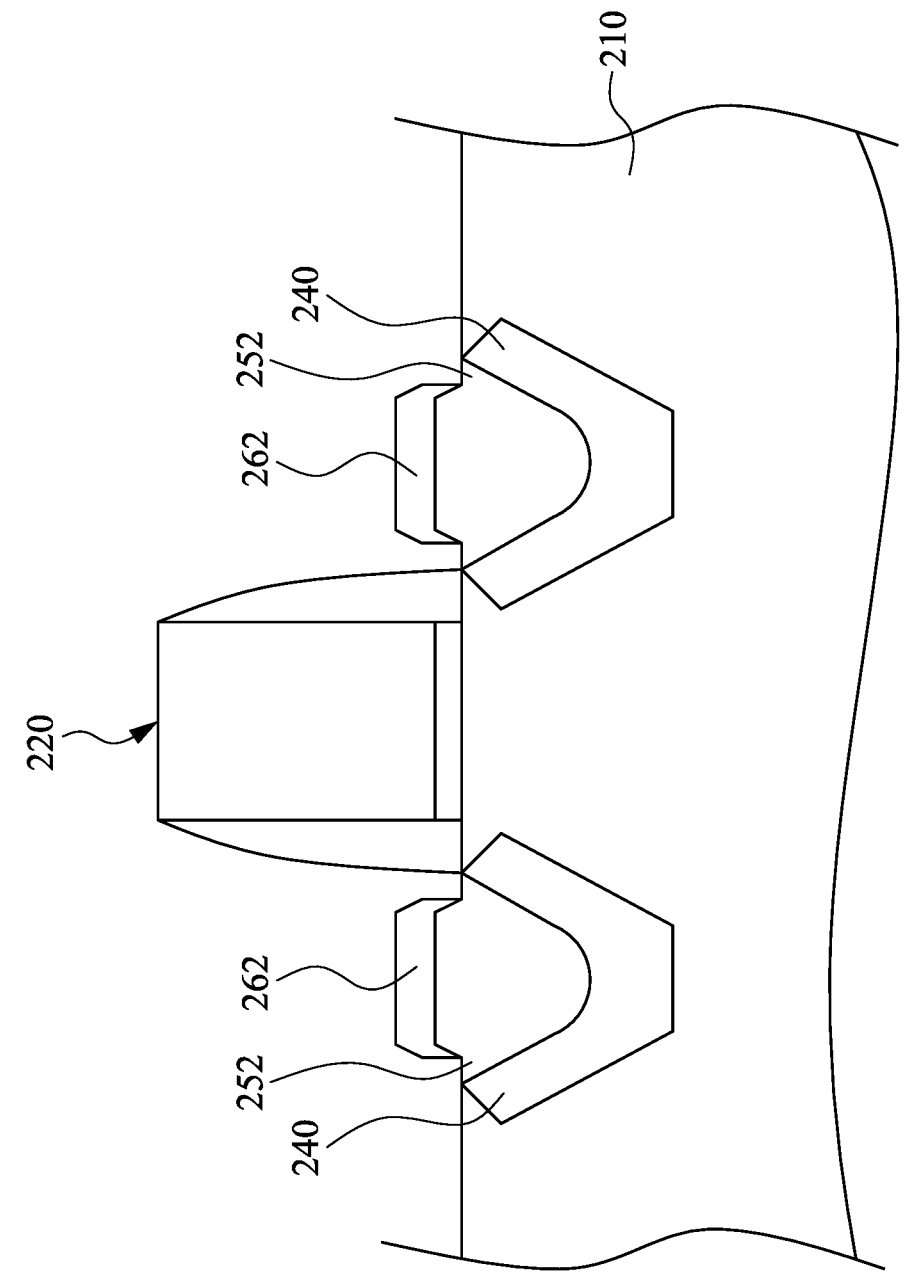

Referring to FIGS. 1, 2F and 2G, in operation 130, a contact layer is formed over the source/drain regions. In embodiments, the contact layers 260, 262 are formed over the source/drain regions 250, 252, respectively, next to the gate structure 220. In some embodiments, the contact layers 260, 262 are formed by epitaxy process, which is the same as the process forming the source/drain regions. According to various embodiments of the present disclosure, the contact layers 260, 262 include silicon having a third dopant. In various embodiments of the present disclosure, the concentration of the third dopant is higher than the concentration of the first/second dopants. The third dopant dosage is in a range from about $1 \times 10^{21}$ cm$^{-3}$ to about $9 \times 10^{21}$ cm$^{-3}$, and a thickness of the contact layers 260, 262 is a range from about 10 nm to about 20 nm. In various embodiments of the present disclosure, the semiconductor device 200 is PMOS, and the third dopant is boron. In some embodiments of the present disclosure, the boron concentration is $10^{21}$ cm$^{-3}$. In various embodiments of the present disclosure, the semiconductor device 200 is NMOS, and the third dopant is phosphorous or arsenic. In various embodiments of the present disclosure, referring to FIG. 2F the contact layers 260 are rectangular shape, formed over the source/drain regions 250. FIG. 2F is the semiconductor device formed after the embodiments in FIG. 2D. In various embodiments of the present disclosure, referring to FIG. 2G, the source/drain regions 252 have protrusions over the top surface of the substrate 210, and the contact layers 262 are in trapezium shape with a trapezium concave at the bottom surface. Further, the contact layers 262 covers the protrusions of the source/drain regions 252, and are not in contact with the gate structure 220. The protrusion part of the source/drain regions 252 covered by the contact layers 262 can reduce the resistance of the semiconductor device. In embodiments, the protrusion part of the source/drain regions 252 are formed by etching after the step in FIG. 2E, or formed directly during the epitaxy process.

Referring to FIG. 2G, in various embodiments of the present disclosure, the semiconductor device 200 includes the substrate 210. The source/drain regions 252 have the first dopant in the substrate at either of two sides of the gate structure. The first dopant includes boron, phosphorous, or arsenic in different devices according to various embodiments of the present disclosure. The source/drain region 252 has the protrusion over the top surface of the substrate 210. The barrier layer 240 has the second dopant in the substrate 210 and surrounding the source/drain regions 252. The barrier layer 240 includes SiGe, and the second dopant includes carbon or nitrogen. The contact layer 262 has the third dopant over the source/drain regions 252, covering the protrusions of the source/drain regions 252. The contact layer 262 includes silicon, and the third dopant is the same as the first dopant, but has higher concentration than the first dopant. The illustrated embodiments show the semiconductor device may be formed at both sides of the gate structure.

With reference to FIGS. 1 and 3A-3F, a method 100 and a semiconductor device 300 are described below according to various embodiments of the present disclosure. The semiconductor device in the depicted embodiments shows that the semiconductor device may be formed between two gate structures.

Figure 3A:
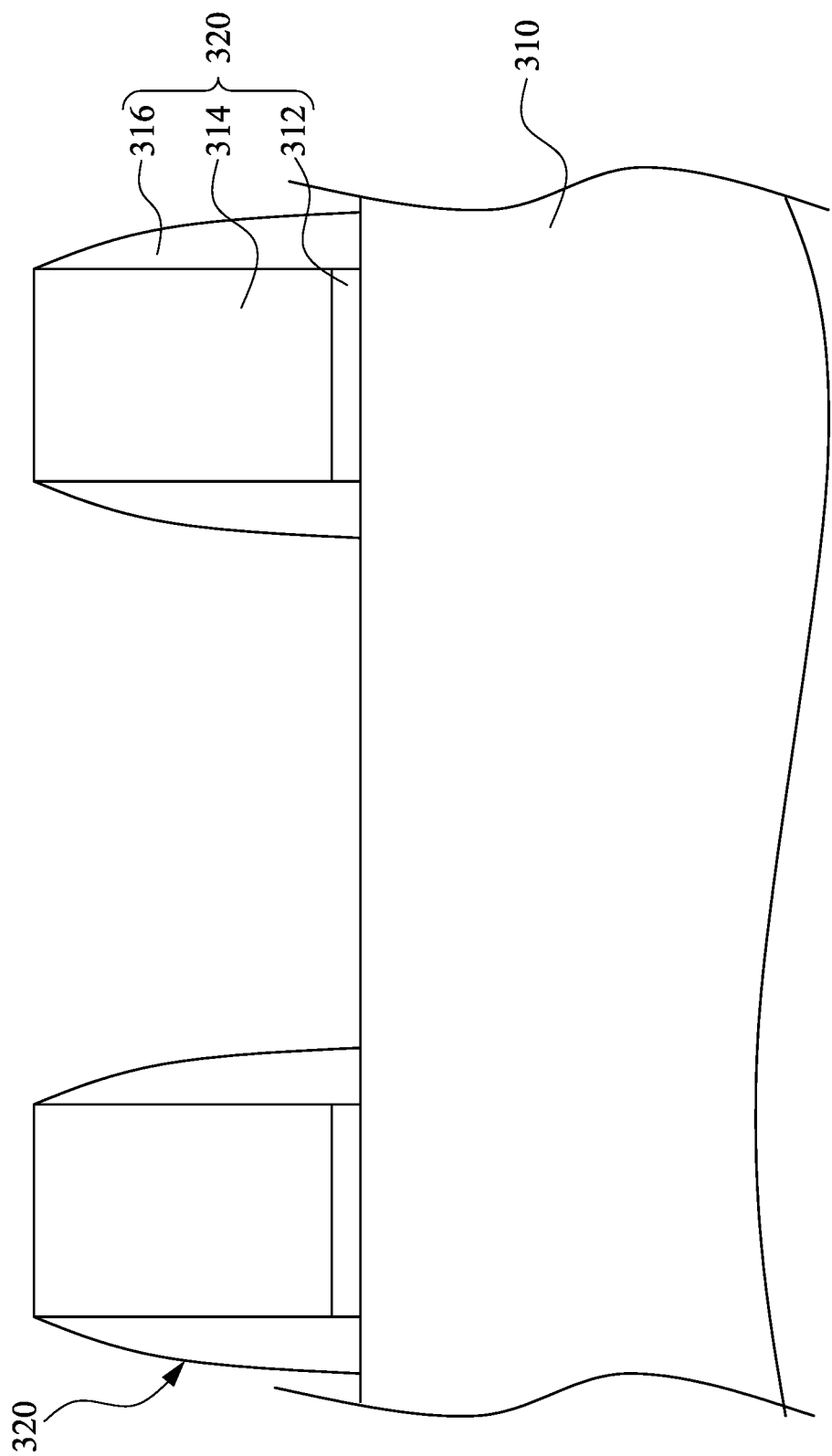
FIGS. 3A-3F are cross-sectional views at various stages of fabricating the semiconductor device according to the method of FIG. 1.

Referring to FIGS. 1 and 3A to 3C, operation 110 is forming a barrier layer including carbon or nitrogen in a substrate. Referring to FIG. 3A, two gate structures 320 are formed on a substrate 310. The substrate 310 includes a semiconductor material like silicon, germanium, carbon, another semiconductor material as an III-V or II-VI material, or combinations thereof. In embodiments, the substrate 310 includes a crystalline silicon substrate (e.g., wafer). Further, the substrate 310 may include an epitaxial layer, which is strained, and/or a silicon-on-insulator (SOI) structure. According to various embodiments of the present disclosure, the substrate 310 may include active regions including various doping configurations, such as p-wells and n-wells, depend on the design rules.

The gate structures 320 are on the substrate 310, and each structure includes a dielectric layer 312 over the substrate 310, a gate electrode 314 over the dielectric layer 312, and two spacers 316 next to both sides of the gate electrode 314. In various embodiments of the present disclosure, the dielectric layer 312 includes silicon oxide or silicon nitride; the gate electrode 314 includes doped or non-doped polysilicon; and the spacers 316 include silicon oxide, silicon oxynitride, silicon nitride or any other suitable material. In various embodiments of the present disclosure, the dielectric layer 312 includes high-k dielectric materials, which includes HfO$_2$, HfSiO, HfSiON, HfTaO, HfTiO, HfZrO or combinations thereof. The gate electrode 314 includes metal such as aluminum, copper, tungsten, metal alloys, metal silicide, other suitable materials or combinations thereof. In various embodiments of the present disclosure, the dielectric layer 312 may be a multi-layer structure (not shown), including an interfacial layer over the substrate 310, or a work function layer under the gate electrode 314. The interfacial layer include silicon oxide, and the work function layer include TiN or TaN for PMOS and Ta, TiAl, TiAlN, or TaCN for NMOS. In embodiments, the gate structures 320 may be formed by deposition, lithography patterning, or etching processes. In various embodiments, the gate structures 320 are dummy gate structures, the gate electrode 314 including polysilicon may be replaced by metal gate electrode after the source/drain region is formed.

Figure 3B:
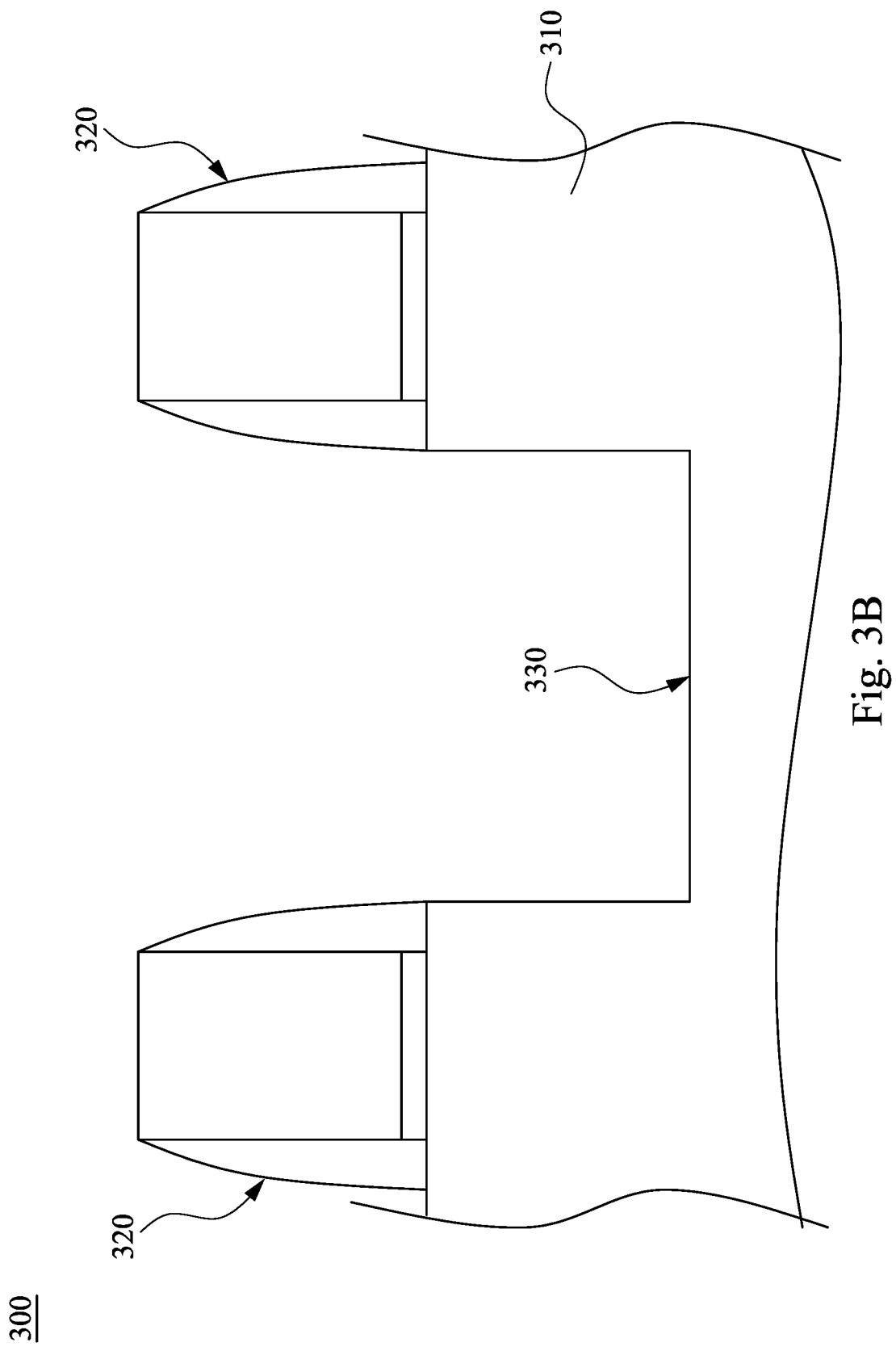

Referring to FIG. 3B, a trench 330 is formed between the two gate structures 320 in the substrate 310. The trench 330 has a tub shape, and the depth of the trench may be in a range from about 30 nm to 50 nm in some embodiments. The trench 330 may be formed by any suitable etching process, such as wet etching or dry etching. In one exemplary anisotropic wet etching process, tetramethylammonium hydroxide (TMAH) is used. The trench 330 may have different shapes such as a surrounding wall shape for a different shape barrier layer 390 as shown in FIG. 3F. In some embodiments, the trench 330 is aligned to the gate structures 320. In some embodiments, the trench 330 may be formed with additional lithography patterning operation making the trench 330 having a distance with the gate structures 320.

Figure 3C:
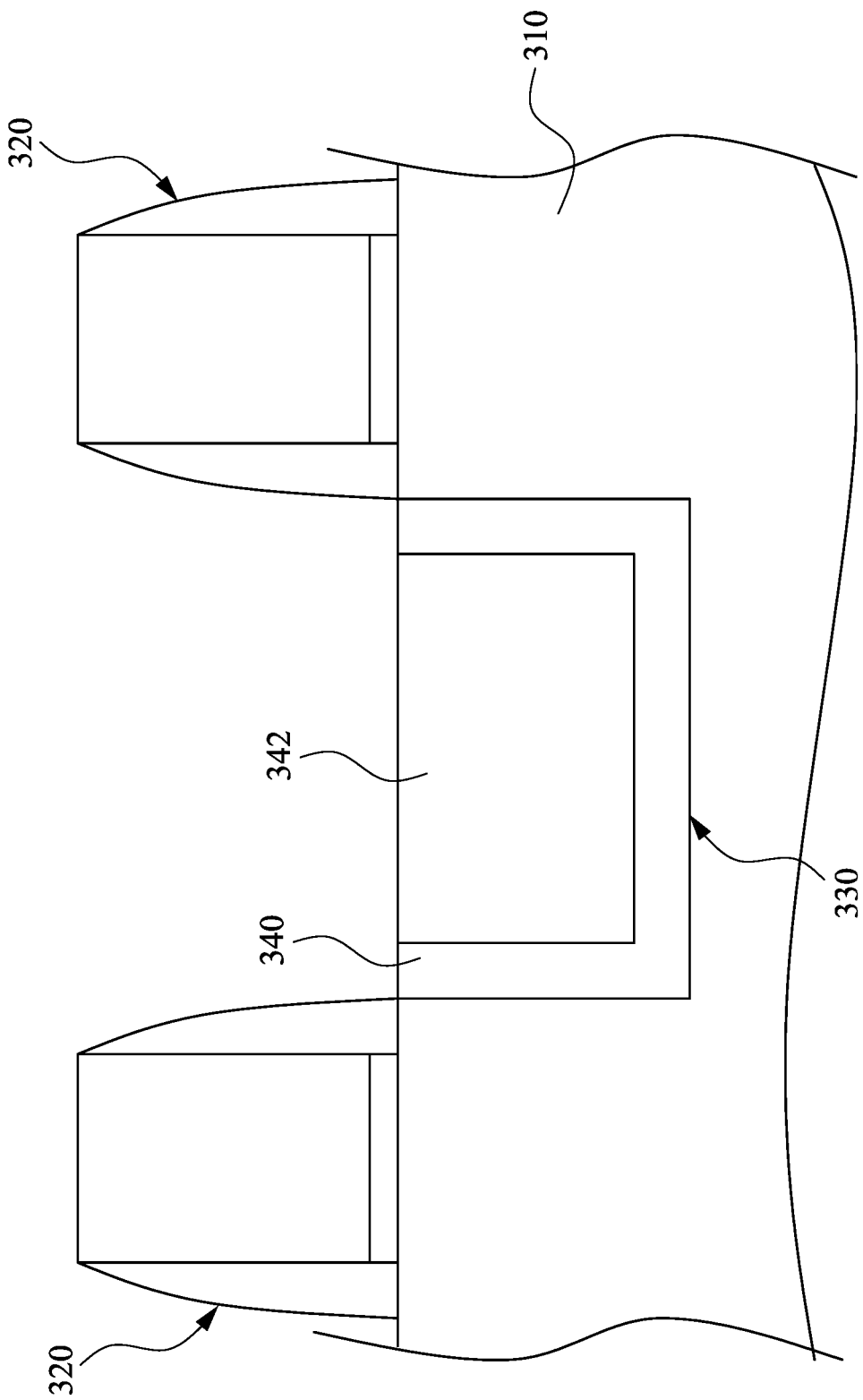

Referring to FIG. 3C, a barrier layer 340 including carbon or nitrogen is formed in the substrate 310. The barrier layer 340 is formed over the trench 330 in the substrate 310. In various embodiments of the present disclosure, the barrier layer 340 is formed by an epitaxy process. The barrier layer 340 including silicon and a second dopant. In some embodiments, the semiconductor device 300 is PMOS and the second dopant is carbon. The carbon dosage is in a range from about $10^{11}$ cm$^{-3}$ to about $10^{14}$ cm$^{-3}$. In some embodiments, carbon dosage is $10^{13}$ cm$^{-3}$. In some embodiments, the semiconductor device 300 is a NMOS and the second dopant is nitrogen. And the nitrogen dosage is in a range from about $10^{15}$ cm$^{-3}$ to about $10^{19}$ cm$^{-3}$. The carbon and nitrogen have abilities to grab the atoms, such that the first dopant in the source/drain region will not move into the substrate 310, thus may control the doped profile. The epitaxy process may include a selective epitaxy growth (SEG) process, cyclic deposition and etching (CDE) process, chemical vapor deposition (CVD) techniques (e.g., vapor-phase epitaxy (VPE) and/or ultra-high vacuum CVD (UHV-CVD)), molecular beam epitaxy (MBE), other suitable epitaxy processes, or combinations thereof.

After the formation of the barrier layer 340, a silicon epitaxial layer 342 is formed over the barrier layer 340 in some embodiments. If the trench 330 of FIG. 3B is formed in a surrounding wall shape without etching away the whole area between the walls, the diffusion barrier layer 390 in FIG. 3F is formed in the surrounding wall shape, thus there is no need to add a silicon epitaxial layer 342. The operation of the in situ doping may be the same with the abovementioned operation in embodiments according to FIGS. 2A-2G.

Figure 3D:
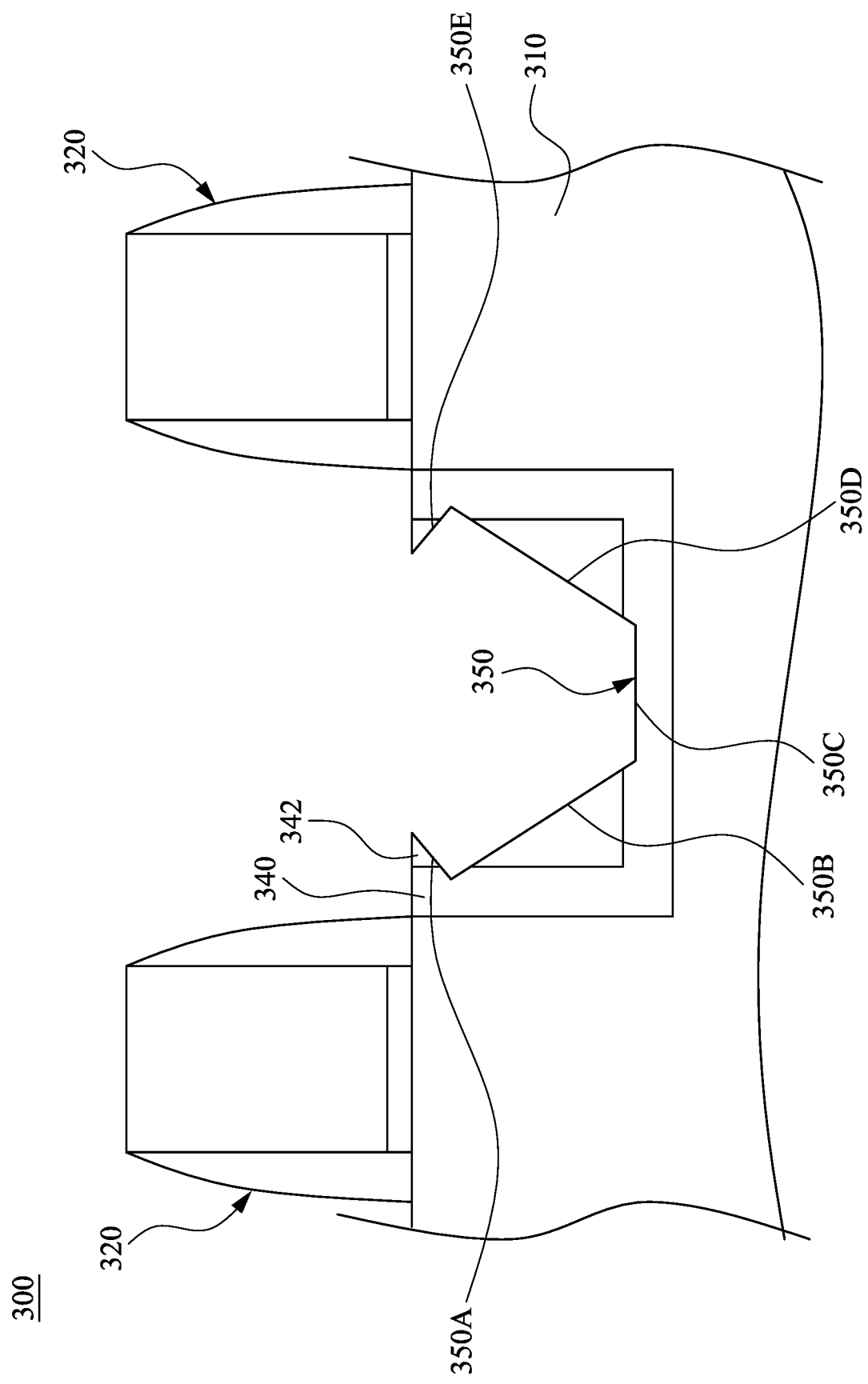
Figure 3E:
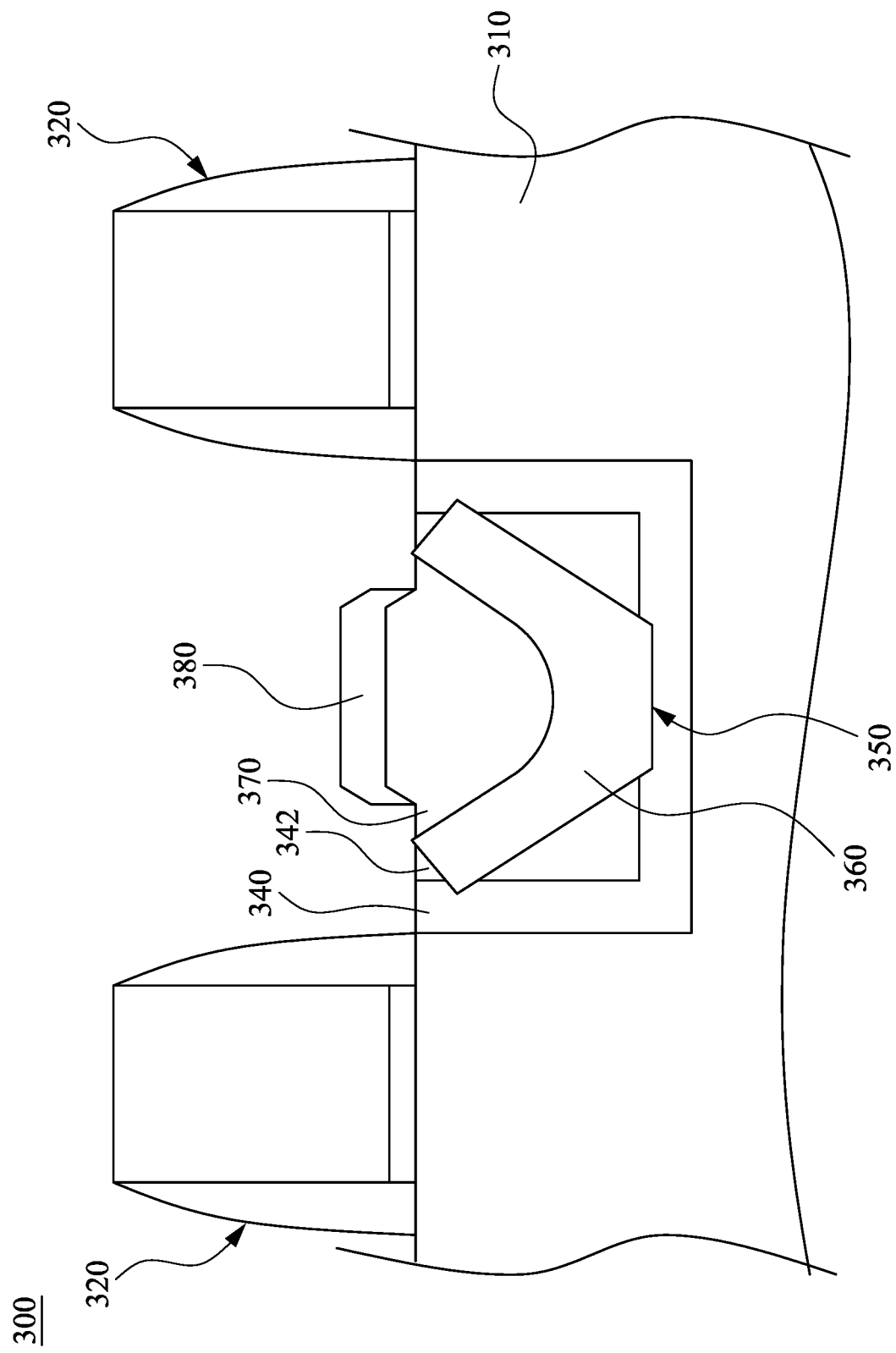
Figure 3F:
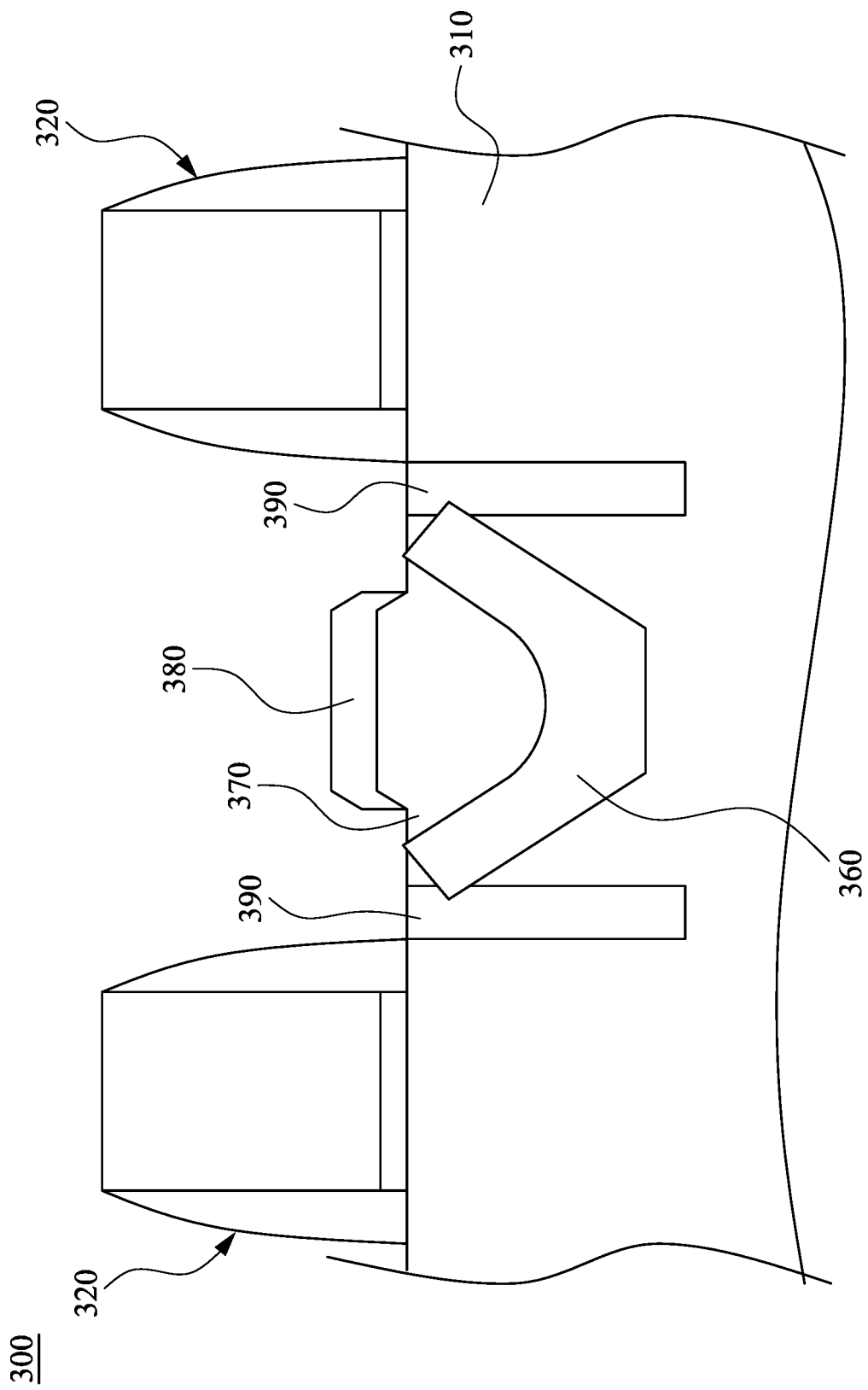

Referring to FIGS. 1 and 3D-3E, in operation 120, a source/drain region is formed and surrounded by the barrier layer. Referring to FIG. 3D a source/drain recess cavity; is formed in the substrate 310 and surrounded by the barrier layer 340. In some embodiments, the source/drain recess cavity 350 is formed in the silicon epitaxial layer 342. The source/drain recess cavity 350 is formed in the substrate 310 and between the gate structures 320. In various embodiments of the present disclosure, the source/drain recess cavity 350 formation include two operations: performing an isotropic etching process at the area surrounded by the barrier layer 340 to form the source/drain recess cavity in the substrate 310; and performing an anisotropic etching process to enlarge the source/drain recess cavity 350 to a diamond shape in the substrate. The isotropic etching process includes a dry etching process, and the anisotropic etching process includes wet etching. In various embodiments of the present disclosure, the source/drain recess cavity 350 has respective sidewall surfaces, each defined by a bottom facet 350C, upper sidewall facets 350A, 350E, and lower sidewall facets 350B and 350D. Thus, the facet 350D and facet 350E are forming intersect with each other and define an angle in the recess cavity 350. In some embodiments, a part of the diamond shape recess cavity 350 extends into the barrier layer 340 in the substrate 310.

Referring to FIGS. 1 and 3E, in operation 120, a source/drain region is formed and surrounded by the barrier layer; and in operation 130, a contact layer is formed over the source/drain region. Referring to FIG. 3E, a strain layer 360 is formed over the source/drain recess cavity 350 in the substrate 310. A source/drain region 370 is formed over the strain layer 360 and fills the source/drain recess cavity 350. A contact layer 380 is formed over the source/drain region 370. The strain layer 360 is formed by an epitaxy process to partially fill the source/drain recess cavity 350. A source/drain region 370 will be formed in the cavity in the following steps, and the strain layer 360 is formed to immediately surround the source/drain region 370 in the substrate 310. In various embodiments of the present disclosure, the strain layer 360 includes silicon germanium (SiGe) and having a fourth dopant, which may be P-type (such as boron, aluminum, indium, or gallium) or N-type dopants (such as phosphorus, arsenic, antimony, or bismuth). The fourth dopant may be formed by implant doping or in situ doping. In some embodiments, the fourth dopant dosage is in a range from about $10^{18}$ cm$^{-3}$ to about $10^{19}$ cm$^{-3}$, and a thickness of the strain layer is in a range from 10 nm to about 20 nm. The strain layer 360 may provide strain to the silicon substrate 310, therefore to enhance the carrier mobility, and the performance of the semiconductor device. The fourth dopant in the strain layer 360 may decrease the resistance for the strain layer 360.

The source/drain region 370 is formed over the strain layer 360 in the source/drain recess cavity 350 surrounded by the barrier layer 340. The source/drain region 370, which is filled into the source/drain recess cavity 350, is formed by an epitaxy process. In some embodiments, the source/drain region 370 includes silicon, and the source/drain region having a first dopant. The first dopant may be the same with the fourth dopant. The first dopant dosage is in a range from about $1\times10^{20}$ cm$^{-3}$ to about $9\times10^{20}$ cm$^{-3}$, and a thickness of the source/drain region 370 is in a range from about 25 nm to about 35 nm. In some embodiments, the source/drain region 370 further includes germanium (Ge). Silicon germanium (SiGe) is a strained material to enhance the carrier mobility in the semiconductor device 300. In various embodiments of the present disclosure, the semiconductor device is PMOS; the source/drain region 370 includes SiGe; and the first dopant is boron. In some embodiments of the present disclosure, the boron concentration is $10^{20}$ cm$^{-3}$. In various embodiments of the present disclosure, the semiconductor device is NMOS; the source/drain region 370 includes silicon carbide (SiC); and the first dopant is phosphorous or arsenic.

The contact layer 380 is formed over the source/drain region 370, between the two gate structures 320. In some embodiments, the contact layer 380 is formed by epitaxy process, which is the same as the process forming the source/drain region. According to various embodiments of the present disclosure, the contact layer 380 includes silicon and has a third dopant. In various embodiments of the present disclosure, the concentration of the third dopant is higher than the concentration of the first dopant. The third dopant dosage is in a range from about $1\times10^{21}$ cm$^{-3}$ to about $9\times10^{21}$ cm$^{-3}$, and a thickness of the contact layer 380 is in a range from about 10 nm to about 20 nm. In various embodiments of the present disclosure, the semiconductor device 300 is a PMOS, and the third dopant is boron. In some embodiments of the present disclosure, the boron concentration is $10^{21}$ cm$^{-3}$. In various embodiments of the present disclosure, the semiconductor device 300 is a NMOS, and the third dopant is phosphorous or arsenic. In various embodiments of the present disclosure, the source/drain region 370 has a protrusion over the top surface of the substrate 310, and the contact layer 380 is in trapezium shape with a trapezium concave at the bottom surface. Further, the contact layer 380 covers the protrusion of the source/drain region 370, and is not in contact with the gate structures 320. The protrusion part of the source/drain region 370 covered by the contact layer 380 may reduce the resistance of the semiconductor device.

Referring to FIG. 3E, in various embodiments of the present disclosure, the semiconductor device 300 includes the substrate 310. The source/drain region 370 has the first dopant in the substrate 310. The first dopant includes boron, phosphorous, or arsenic in different devices according to various embodiments of the present disclosure. The source/drain region 370 has the protrusion over the top surface of the substrate 310. The strain layer 360 includes the fourth dopant immediately surrounding the source/drain region 370. The fourth dopant is the same with the first dopant, but has lower dopant concentration than the first dopant. The barrier layer 340 has the second dopant in the substrate 310 and surrounding the source/drain region 370 in a tub shape. The barrier layer 340 includes silicon, and the second dopant includes carbon or nitrogen. The contact layer 380 has the third dopant over the source/drain region 370, covering the protrusions of the source/drain region 370. The contact layer 380 includes silicon, and the third dopant is the same as the first dopant, but has higher dopant concentration than the first dopant.

Referring to FIG. 3F, FIG. 3F shows some other embodiments of the exemplary semiconductor device with a different barrier layer 390 shape after following similar fabrication operations of FIGS. 3A-3E according to some embodiments. The difference between the embodiments in FIG. 3G and FIG. 3F is the shape of the barrier layer. The barrier layer 390 has a wall shape and surrounds the source/ drain region 370, to prevent the first dopant in the source/drain region 370 diffuse into the channel region and enhance the resistance. Using etching and epitaxial process to form the barrier layer 390, the location, depth, and shape may be better controlled compared to some other methods.

Therefore, in various embodiments of the present disclosure, a method of fabricating a semiconductor device and a semiconductor device is provided. The semiconductor device with the barrier layer doped with carbon or nitrogen surrounding the source/drain regions may improve the threshold voltage and saturation current uniformity, which may be affected by the dopants diffusing from the source/drain region to the well or the substrate. Also, the barrier layer with carbon or nitrogen doped may control the dopant profile in the source/drain regions. The barrier layer may be formed in a diamond shape and immediately surround the source/drain layer, or formed in a tub shape or a wall shape surrounding the source/drain layer. The contact layer doped boron over the source/drain regions, covering the protrusions of the source/drain regions.

In some embodiments, a method of fabricating a semiconductor device includes following steps. A trench is formed in a substrate. A barrier layer and an epitaxy layer are formed in sequence in the trench. The barrier layer has a first dopant. A source/drain recess cavity is formed by etching at least the epitaxial layer. A source/drain region is formed in the source/drain recess cavity. The source/drain region has a second dopant.

In some embodiments, the forming the source/drain recess cavity includes etching the barrier layer.

In some embodiments, the forming the source/drain recess cavity is performed such that the source/drain recess cavity has a bottom facet, a plurality of first sidewall facets extending outwardly from the bottom facet, and a plurality of second sidewall facets extending inwardly from the first sidewall facets.

In some embodiments, the method further includes forming a contact layer over the source/drain region.

In some embodiments, the first dopant includes carbon or nitrogen.

In some embodiments, the barrier layer is formed by an epitaxy process.

In some embodiments, the forming the barrier layer includes in situ doping the barrier layer with the first dopant.

In some embodiments, the second dopant includes boron.

In some embodiments, the forming the barrier layer is performed such that the barrier layer is formed over sidewalls of the trench.

In some embodiments, the forming the barrier layer is performed such that the barrier layer is further formed over a bottom surface of the trench.

In some embodiments, a method of fabricating a semiconductor device includes following steps. A source/drain recess cavity is formed in a substrate. A barrier layer is formed in the source/drain recess cavity by an epitaxy process. The barrier layer has a first dopant. A source/drain region is formed on the barrier layer in the source/drain recess cavity. The source/drain region has a second dopant.

In some embodiments, the forming the barrier layer includes in situ doping the barrier layer with the first dopant.

In some embodiments, the first dopant includes carbon or nitrogen.

In some embodiments, the second dopant comprises boron.

In some embodiments, the forming the source/drain recess cavity is performed such that the source/drain recess cavity has a diamond shape.

In some embodiments, a semiconductor device includes a substrate, a barrier layer, a source/drain region and an epitaxial layer. The barrier layer is in the substrate and has a first dopant. The source/drain region is surrounded by the barrier layer and has a second dopant. The epitaxial layer is between the source/drain region and the barrier layer.

In some embodiments, the source/drain region has a top in a position higher than a top of the barrier layer.

In some embodiments, the source/drain region is in contact with the barrier layer.

In some embodiments, the barrier layer has a portion under the source/drain region.

In some embodiments, the source/drain region has a diamond shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising in sequential order of:
   forming a gate structure over a channel region of a substrate;
   forming a trench in the substrate and adjacent to the gate structure;
   forming, in sequence, a barrier layer and an epitaxial layer in the trench, wherein the barrier layer has a first dopant;
   forming a source/drain recess cavity by etching the epitaxial layer;
   etching the barrier layer while etching the epitaxial layer; and
   forming a source/drain region in the source/drain recess cavity, wherein the source/drain region has a second dopant, and wherein a portion of the etched barrier layer is interposed between the source/drain region and the channel region after forming the source/drain region in the source/drain recess cavity.

2. The method of claim 1, wherein the forming the source/drain recess cavity is performed such that the source/drain recess cavity has a bottom facet, a plurality of first sidewall facets extending outwardly from the bottom facet, and a plurality of second sidewall facets extending inwardly from the first sidewall facets.

3. The method of claim 1, further comprising:
   forming a contact layer over the source/drain region.

4. The method of claim 1, wherein the first dopant comprises carbon or nitrogen.

5. The method of claim 1, wherein the forming the barrier layer comprises in situ doping the barrier layer with the first dopant.

6. The method of claim 1, wherein the second dopant comprises boron.

7. The method of claim 1, wherein the forming the barrier layer is performed such that the barrier layer is formed over sidewalls of the trench.

8. The method of claim 7, wherein the forming the barrier layer is performed such that the barrier layer is further formed over a bottom surface of the trench.

9. The method of claim 1, wherein forming the barrier layer and the epitaxial layer is such that the barrier layer surrounds the epitaxial layer.

10. A method of fabricating a semiconductor device, the method comprising in sequential order of:
   forming a gate structure that extends from a surface of a substrate;
   forming a trench in the substrate and adjacent to the gate structure;
   epitaxially growing a barrier layer lining the trench, wherein the barrier layer has a first dopant;
   epitaxially growing an epitaxial layer over the barrier layer, such that the barrier layer is in direct contact with at least opposite sidewalls of the epitaxial layer;
   etching the epitaxial layer and a portion of the barrier layer to form a source/drain recess cavity; and
   forming a source/drain region that is in the source/drain recess cavity and that has a second dopant.

11. The method of claim 10, further comprising forming a strain layer such that the strain layer has a substantially U-shaped cross section.

12. The method of claim 10, wherein the barrier layer is between the gate structure and the source/drain region, and the first and second dopants include different materials.

13. The method of claim 12, further comprising forming a strain layer such that the strain layer extends into the barrier layer.

14. The method of claim 12, wherein forming the barrier layer is such that the barrier layer has a cross section that extends transverse to the surface of the substrate.

15. A method of fabricating a semiconductor device, the method comprising in sequential order of:
   forming a gate structure over a substrate;
   forming a trench in the substrate adjacent the gate structure;
   epitaxially growing a barrier layer lining the trench, wherein the barrier layer has a first dopant and has first and second portions on opposite sidewalls of the trench respectively;
   filling the trench with an epitaxial layer after epitaxially growing the barrier layer;
   etching the epitaxial layer and the first and second portions of the barrier layer to form a source/drain recess cavity; and
   filling the source/drain recess cavity with a source/drain region.

16. The method of claim 15, further comprising filling the trench with a strain layer between the source/drain region and the epitaxial layer.

17. The method of claim 15, wherein filling the trench with the epitaxial layer is such that a cross section of the epitaxial layer includes first and second portions spaced apart from each other.

18. The method of claim 17, wherein filling the trench with the epitaxial layer is such that the cross section of the epitaxial layer further includes a third portion spaced apart from the first and second portions.

19. The method of claim 15, wherein the epitaxially growing the barrier layer is performed such that the epitaxial layer is between the source/drain region and the barrier layer and such that the barrier layer has a U-shaped cross section.

20. The method of claim 15, wherein the etching the epitaxial layer and the first and second portions of the barrier layer is performed after the filling the trench with the epitaxial layer.

* * * * *